(12) United States Patent
Deligianni et al.

(10) Patent No.: US 9,362,440 B2
(45) Date of Patent: Jun. 7, 2016

(54) 60×120 CM² PROTOTYPE ELECTRODEPOSITION CELL FOR PROCESSING OF THIN FILM SOLAR PANELS

(71) Applicant: International Business Machines Corporation, Armonk, NY (US)

(72) Inventors: Hariklia Deligianni, Tenafly, NJ (US); Lubomyr T. Romankiw, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 433 days.

(21) Appl. No.: 13/644,505

(22) Filed: Oct. 4, 2012

(65) Prior Publication Data

US 2014/0097091 A1     Apr. 10, 2014

(51) Int. Cl.
*H01L 31/18*     (2006.01)
*C25D 17/06*     (2006.01)
*H01L 31/032*    (2006.01)

(52) U.S. Cl.
CPC ............ *H01L 31/18* (2013.01); *H01L 31/0326* (2013.01); *Y02E 10/50* (2013.01)

(58) Field of Classification Search
CPC ...... C25D 17/00; C25D 17/001; C25D 17/06; C25D 5/04; C25D 5/10; C25D 21/10; C25D 21/08
USPC ........................ 205/145, 137; 204/202–211; 226/170–173, 108–118.5
See application file for complete search history.

(56) References Cited

U.S. PATENT DOCUMENTS

| | | | | |
|---|---|---|---|---|
| 3,619,383 A | * | 11/1971 | Eisner | 205/93 |
| 3,904,489 A | * | 9/1975 | Johnson | 205/117 |
| 4,428,814 A | * | 1/1984 | Chen | 204/273 |
| 5,024,745 A | * | 6/1991 | Rischke et al. | 204/198 |
| 5,312,532 A | | 5/1994 | Andricacos et al. | |
| 5,516,412 A | | 5/1996 | Andricacos et al. | |
| 6,261,426 B1 | * | 7/2001 | Uzoh et al. | 204/224 R |
| 6,685,814 B2 | | 2/2004 | Uzoh et al. | |
| 6,887,113 B1 | * | 5/2005 | Langheinrich | 439/822 |
| 7,172,184 B2 | * | 2/2007 | Pavani et al. | 269/37 |
| 7,303,065 B2 | * | 12/2007 | Kaufman et al. | 198/803.7 |
| 2007/0227633 A1 | * | 10/2007 | Basol | 148/518 |
| 2012/0061247 A1 | | 3/2012 | Ahmed et al. | |
| 2012/0061250 A1 | | 3/2012 | Ahmed et al. | |
| 2012/0061790 A1 | | 3/2012 | Ahmed et al. | |

* cited by examiner

*Primary Examiner* — James Lin
*Assistant Examiner* — Leo Ahnn
(74) *Attorney, Agent, or Firm* — Louis J. Percello; Michael J. Chang, LLC

(57) ABSTRACT

Techniques for electrodeposition of thin film solar panels are provided. In one aspect, an electrodeposition apparatus is provided. The electrodeposition apparatus includes at least one electroplating cell; and a conveyor for moving panels over the electroplating cell, wherein the conveyor comprises at least one metal belted track over the electroplating cell surrounding a plurality of metal rollers. The electroplating cell can include an anode at a bottom of the electroplating cell; and a plurality of paddles at a top of the electroplating cell. A baffle may be located in between the anode and the paddles. An electroplating process is also provided.

21 Claims, 9 Drawing Sheets

100

200

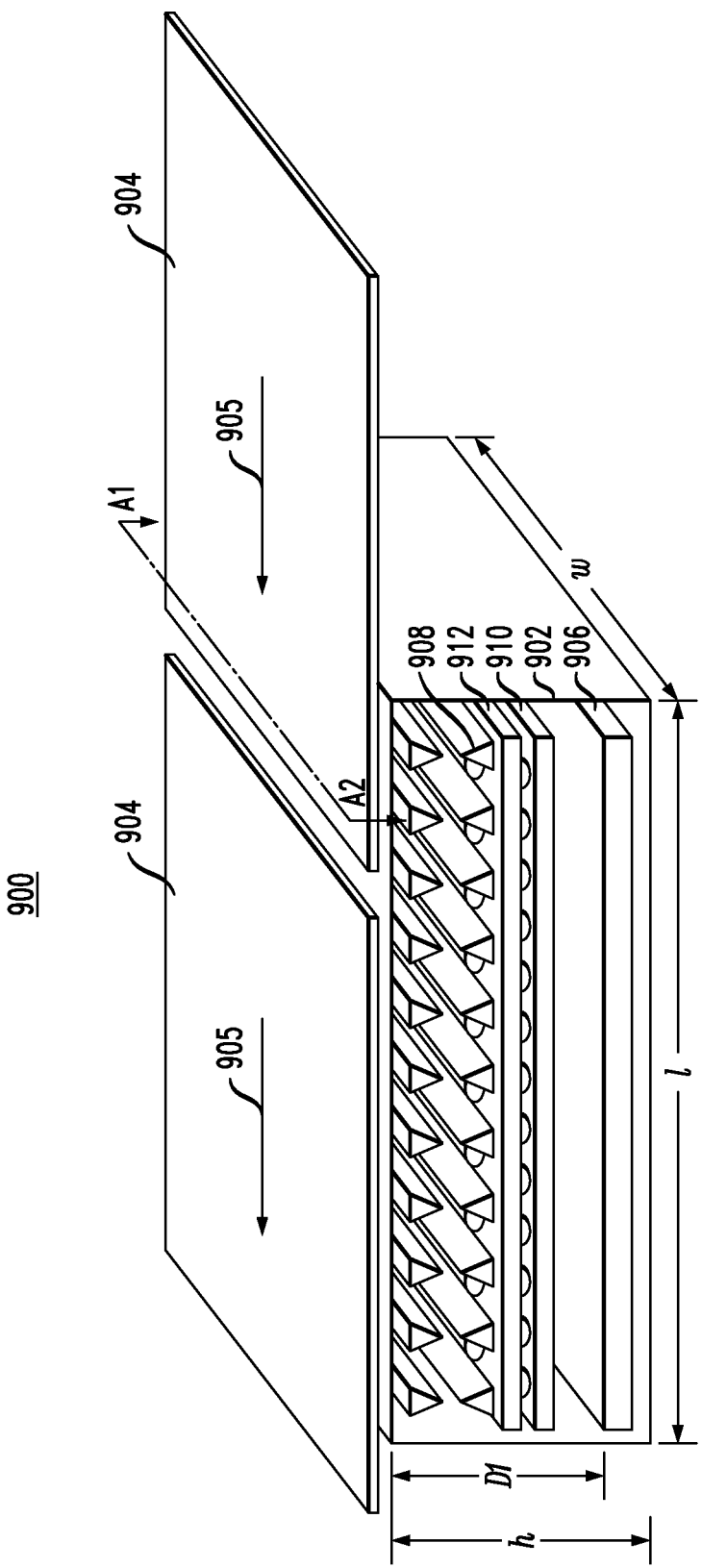

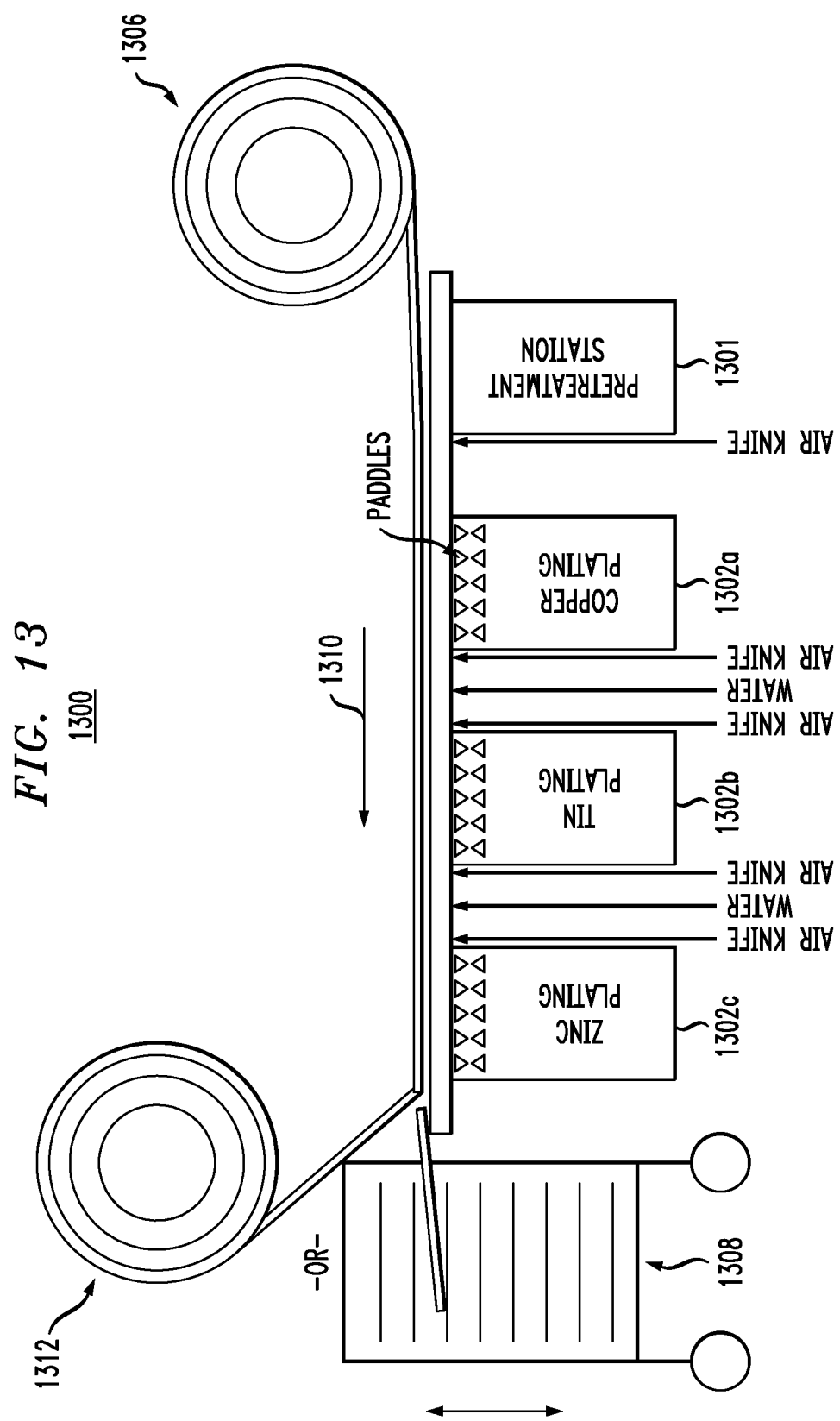

60×120 CM² PROTOTYPE ELECTRODEPOSITION CELL FOR PROCESSING OF THIN FILM SOLAR PANELS

FIELD OF THE INVENTION

The present invention relates to electrodeposition and more particularly, to techniques for electrodeposition of thin film solar panels.

BACKGROUND OF THE INVENTION

Electrodeposition is a convenient way to fabricate thin film solar cells. In particular, electrodeposition is used to deposit the material(s) that form the absorber layer of the solar cell. See, for example, U.S. Patent Application Publication Number 2012/0061247 A1 filed by Ahmed et al. on Sep. 9, 2010 entitled "Method and Chemistry for Selenium Electrodeposition," U.S. Patent Application Publication Number 2012/0061250 A1 filed by Ahmed et al. on Sep. 9, 2010 entitled "Zinc Thin Films Plating Chemistry and Methods," and U.S. Patent Application Publication Number 2012/0061790 A1 filed by Ahmed et al. on Sep. 9, 2010 entitled "Structure and Method of Fabricating a CZTS Photovoltaic Device by Electrodeposition," the contents of each of which are incorporated by reference herein. The composition of the absorber layer can be controlled by the materials that are deposited during the electrodeposition process.

Scaling-up the process to enable fabrication of large thin film solar panels can be quite challenging. For example, in some instances multiple solar cells are fabricated individually and then assembled into panels. Depending on the size of each individual solar cell, this process can prove to be inefficient, extremely costly and time-consuming. There is a tremendous cost benefit in fabricating panels end-to-end. There is a need for a low cost method of thin film solar panel fabrication with high precision and high yield. A typical thin film solar panel has dimensions of 60×120 cm².

Therefore, improved techniques for scaling-up the electrodeposition process for fabricating thin film solar panels would be desirable.

SUMMARY OF THE INVENTION

The present invention provides techniques for electrodeposition of thin film solar panels. In one aspect of the invention, an electrodeposition apparatus is provided. The electrodeposition apparatus includes at least one electroplating cell; and a conveyor for moving panels over the electroplating cell, wherein the conveyor comprises at least one metal belted track over the electroplating cell surrounding a plurality of metal rollers. The electroplating cell can include an anode at a bottom of the electroplating cell; and a plurality of paddles at a top of the electroplating cell. A baffle and shields may be located in between the anode and the paddles.

In another aspect of the invention, an electroplating process is provided. The process includes the following steps. An electrodeposition apparatus is provided having at least one electroplating cell containing an electroplating solution and a conveyor having least one metal belted track over the electroplating cell surrounding a plurality of metal rollers. At least one panel is placed onto the conveyor. The conveyor is used to move the panel over the electroplating cell. Current or potential is supplied to the panel through the metal rollers and the metal belted track to plate the panel using the electroplating solution.

A more complete understanding of the present invention, as well as further features and advantages of the present invention, will be obtained by reference to the following detailed description and drawings.

BRIEF DESCRIPTION OF THE DRAWINGS

FIG. 9 is a diagram illustrating an exemplary configuration of one of the electroplating cells in the apparatus of FIG. 2 according to an embodiment of the present invention;

FIG. 13 is a diagram illustrating an exemplary apparatus for thin film solar panel fabrication that can be operated as a operate as a continuous line process according to an embodiment of the present invention.

DETAILED DESCRIPTION OF PREFERRED EMBODIMENTS

The present techniques are directed to a continuous method and apparatus for the fabrication of thin film solar panels using high speed, low cost electrodeposition. Namely, provided herein are electrodeposition-based techniques for fabricating solar panels at the panel level, i.e., by fabricating all of the solar cells in the panel at one time (rather than individually), thus permitting efficient scale-up of the process to standard 60×120 square centimeter (cm$^2$) or any other desired panel size/dimensions. The present techniques can be employed as a continuous line process feeding the panels continuously.

Figure 1:
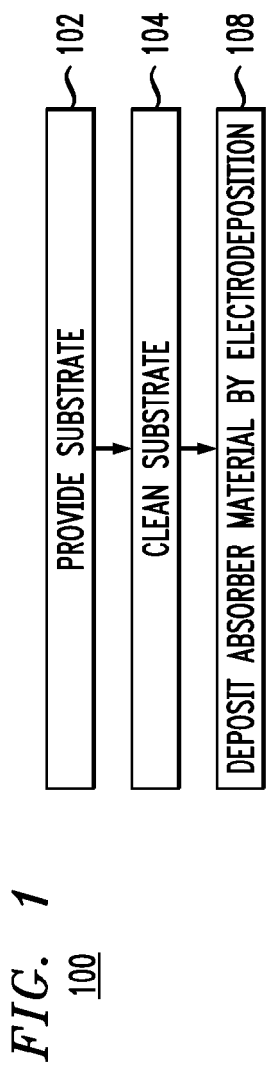
FIG. 1 is a diagram illustrating an exemplary methodology for fabricating a solar panel according to an embodiment of the present invention.

In order to understand the present techniques, a description of the steps employed to form a thin film solar panel by electrodeposition is now provided by way of reference to FIG. 1. FIG. 1 is a diagram illustrating an exemplary methodology 100 for fabricating a thin film solar panel by electrodeposition. FIG. 1 provides an overview of the electrodeposition processing steps that are performed to fabricate the present solar panels. The apparatus and techniques that are implemented in forming the absorber layer according to the present techniques will be described in further detail below.

In step 102, a substrate is provided. According to an exemplary embodiment, the substrate is provided having a backside electrode formed on a surface thereof. By way of example only, the backside electrode can be formed from a thin layer (e.g., having a thickness of from about 500 nanometers (nm) to about 1,200 nm) of molybdenum blanket deposited on the substrate. Additionally, a seed layer (such as a copper, tin and/or zinc layer having a thickness of from about 40 nm to about 100 nm) may be deposited on the backside electrode (i.e., on a side of the backside electrode opposite the substrate). The seed layer serves to facilitate the electrodeposition of the device layers onto the substrate as described in detail below.

Suitable substrate materials include, but are not limited to, glass or metal foil sheets. Suitable metal foil materials include, but are not limited to, copper sheets, stainless steel sheets and/or aluminum foil sheets. As highlighted above, the scale-up to full 60×120 cm$^2$ is addressed by the present techniques. Thus, according to an exemplary embodiment, the substrate provided in this step has a width of 60 centimeters (cm). Thus the length can be cut to any dimension, e.g., 120 cm, once fabrication of the requisite components has been completed. According to the present techniques described in detail below, an apparatus and techniques for use thereof are provided for electrodepositing absorber layer components onto blank solar panels. These panels are what are being described here generically as the substrate (i.e., the term "substrate" generically describes any structure on which the absorber layer is formed). Thus, the terms "panel" and "substrate" are used interchangeably herein.

In step 104, according to an exemplary embodiment, the substrate is pre-treated. The pre-treatment process is employed to clean the surface of the substrate onto which materials will be electrodeposited by the present method. For instance, the pre-treatment serves to remove chemicals that can adhere to the surface of the substrate and which can result in poor adhesion later in the process.

By way of example only, the pre-treatment process can include a predip in a sulfuric acid and/or ammonia containing solution. For instance, pre-treatment for a copper seed layer-coated substrate may include, but is not limited to, a predip in a 10% sulfuric acid solution. For a molybdenum-coated substrate, a predip in an ammonia-containing solution may be employed. Other suitable pre-treatment options may be implemented by one of skill in the art. According to the present techniques, this pre-treatment step is carried out before the substrate is placed on the electrodeposition apparatus described below.

In step 106, an absorber material is deposited on the substrate on top of the backside electrode. The detailed steps for depositing the absorber materials onto the substrate are described below. A notable advantage of the present techniques is that the deposition of the absorber materials can be performed (in one or multiple steps) uniformly (both in microstructure and in composition) onto large panels, a task which is not possible with conventional processes.

Figure 2:
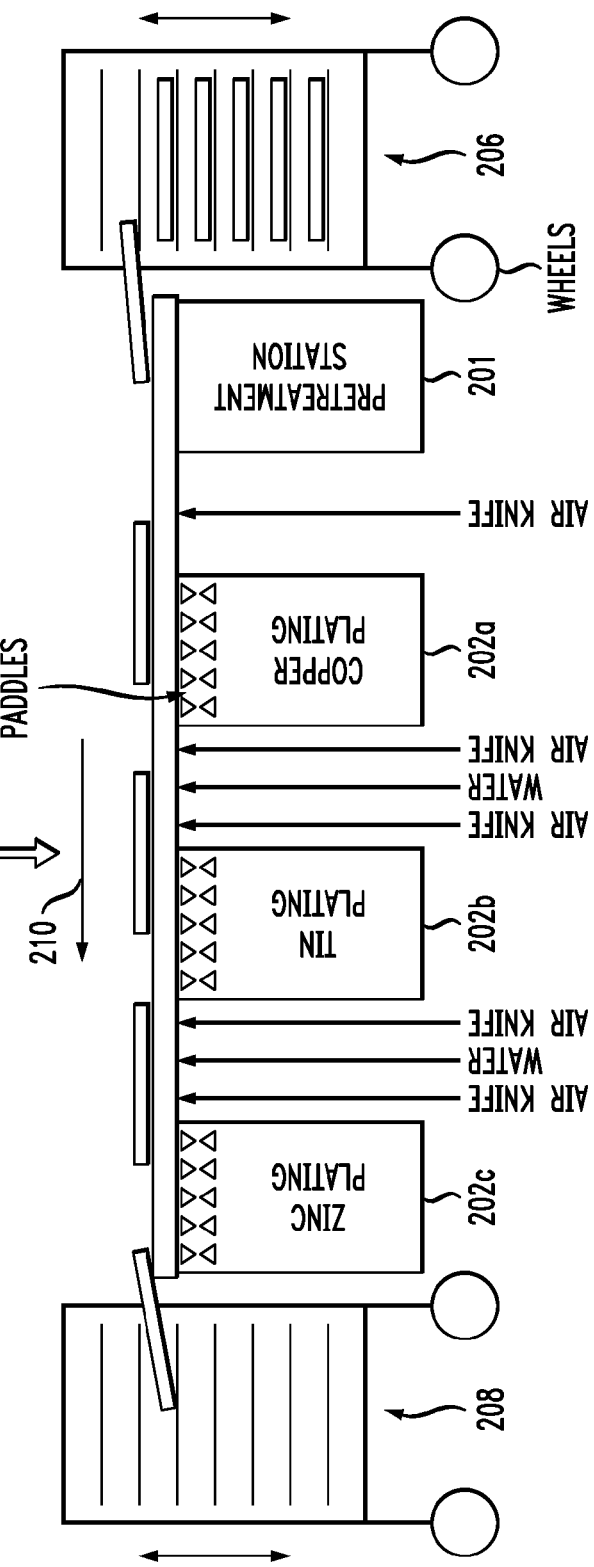
FIG. 2 is a diagram illustrating an exemplary apparatus for thin film solar panel fabrication according to an embodiment of the present invention.

FIG. 2 is a diagram illustrating an exemplary electrodeposition apparatus 200 suitable for thin film solar panel fabrication. Apparatus 200 includes a pre-treatment cell 201, at least one electroplating cell 202 (e.g., electroplating cell 202a, 202b, etc.), and a conveyor mechanism for moving one or more panels sequentially over the pre-treatment cell/electroplating cell(s) from a cart 206 of blank panels at a beginning stage to a cart 208 of completed panels at an end stage of the processing. It is notable that for clarity of depiction, the features shown in FIG. 2 are not necessarily drawn to scale. For instance, the distance between the plating cells is preferably at least one panel length (which is approximately shown in FIG. 2). The typical size of the plating tanks can be length equal to the size of the panel, width equal to the size of the panel plus the width of the metal frame and depth that is not critical. There should be enough distance between the panel (working electrode and the counter electrode for the paddles to fit in and to adequately agitate the solution next to the working electrode.

A cleaning and/or rinsing and cleaning between cells is accomplished by way of an air knife/knives and a water jet, respectively, located between the cells. This aspect of the apparatus will be described in further detail below. The air knife is placed in the path of travel of the panels (i.e., the path of travel of the panels is indicated in FIG. 2 by arrow 210) directly after a given electroplating cell. Thus, once a panel passes over the cell, any excess plating solution is removed from the panel (by the air knife). As will be described in detail below, this excess plating solution falls into an overflow chamber and is then pumped back into the electroplating cell. By this action, the plating solution is conserved in the process. Following this removal of excess solution by the air knife, the water jet is used to clean the panel followed by a second air knife which is used to remove the water and any remaining solution from the previous electroplating cell before the panel passes over the next electroplating cell. Preferably this process occurs between each of the electroplating cells.

In the exemplary embodiment shown in FIG. 2, apparatus 200 includes multiple electroplating cells 202. This is however merely exemplary and embodiments are anticipated herein where only a single electroplating cell is present in the apparatus. For instance, one electroplating cell (202a) can be used to plate copper (Cu), copper selenide (CuSe), and/or copper sulfide ($Cu_2S$, CuS) on the panel, followed by another electroplating cell which can be used to plate selenium (Se), followed by another electroplating cell which can be used to plate tin (Sn), tin selenide (SnSe), and/or tin sulfide (SnS) on the panel, and a last electroplating cell that can be used to plate zinc (Zn), zinc selenide (ZnSe), and/or zinc sulfide (ZnS) so on. However, depending on the application at hand, the plating solution containing a metal alloy, a single metal, a single chalcogenide, chalcogen, kesterite, oxide, compound semiconductor for example may be contained in a single electroplating cell 202. For instance, in principle one can have from one cell in which a metallic precursor alloy of CuZnSn or a semiconducting precursor of $Cu_2ZnSnSe_4$ ($Cu_2ZnSnS_4$) will be electroplated or up to 4 cells (such as in the example provided above) where the individual layers of Cu, Sn, Zn and Se will be electroplated. FIG. 2 demonstrates one preferred embodiment wherein 3 electroplating cells 202a/202b/202c contain solutions with Cu/Sn/Zn, respectively. With the approach shown illustrated in FIG. 2, $Cu_2ZnSnS_4$ solar cells total area of 0.45 cm$^2$ have been demonstrated with power conversion efficiency of 7.3% and $Cu_2ZnSnSe_4$ with efficiency of 7%. For these demonstrations, electroplating of the Cu/Sn/Zn precursor had an area of 225 cm$^2$ and the solar cell total area was 0.45 cm$^2$.

As described above, in the fabrication process of a solar panel, a pre-treatment prior to absorber layer deposition is preferred. See description of step 104 (of FIG. 1) above. In the exemplary embodiment shown in FIG. 2, this pretreatment is performed using pretreatment cell 201. As provided above, the pretreatment step may include washing the panel with a sulfuric acid and/or ammonia containing solution. The given pretreatment solution is contained in pretreatment cell 201, and as the panel passes over the pretreatment cell 201, the pretreatment solution is sprayed onto the panel using spray nozzles.

As shown in FIG. 2, each of the electroplating cells 202 contains a series of paddles near the interface with the panels. As will be described in detail below, the paddles serve to agitate the plating solution near the surface of the panel which increases uniformity of plating, etc.

Carts 206 and 208 serve to introduce new panels to and remove completed/plated panels from the system. As shown in FIG. 2, carts 206 and 208 are on wheels thus facilitating bringing new 'blank' panels and removing completed panels from apparatus 200. According to an exemplary embodiment, offloading panels from and loading panels onto carts 206 and 208, respectively, is done in an automated fashion. Namely, as shown in FIG. 2, cart 206 includes a number of shelves, each shelf containing a panel. Cart 206 can be raised or lowered to align one of the shelves (and thus the panel on that shelf) with the conveyor above the electroplating cells 202. Panels can be offloaded from cart 206 shelf-by-shelf in a sequential manner. For instance, starting with the topmost (or bottommost) shelf, the panel on that shelf is offloaded from cart 206 onto the conveyor. The cart then raises (or lowers) the distance needed to place the next highest (or lowest) shelf in line with the conveyor. The panel from that shelf is offloaded from cart 206, and so on. The same process is used regarding the loading of completed panels onto cart 208. As shown in FIG. 2, cart 208 includes a number of shelves. Panels can be loaded onto cart 208 shelf-by-shelf in a sequential manner. Like cart 206, cart 208 can be raised or lowered to align one of its shelves with the conveyor and thus receive a panel. Assume for instance that cart 208 begins with its shelves completely empty. Starting with the topmost (or bottommost) shelf, a panel coming off of the conveyor is loaded onto that shelf. The cart then raises (or lowers) the distance needed to place the next highest (or lowest) shelf in line with the conveyor. The next panel off of the conveyor is loaded onto that shelf, and so on. When cart 206 is empty (has no more panels) and/or when cart 208 is full of panels, then new cart 206 filled with panels may be provided and/or an empty cart 208 can be provided to receive the panels.

According to an exemplary embodiment, carts 206 and 208 are identical to one another, i.e., operate/function in the same manner and have the same structure, dimensions, etc. and thus interchangeable. Accordingly, when all of the panels have been offloaded from a cart 206, that empty cart 206 can be moved to the end of the conveyor to serve as a receiving cart 208, while a new cart 206 with panels is provided at the beginning of the conveyor, and so on.

Figure 3:
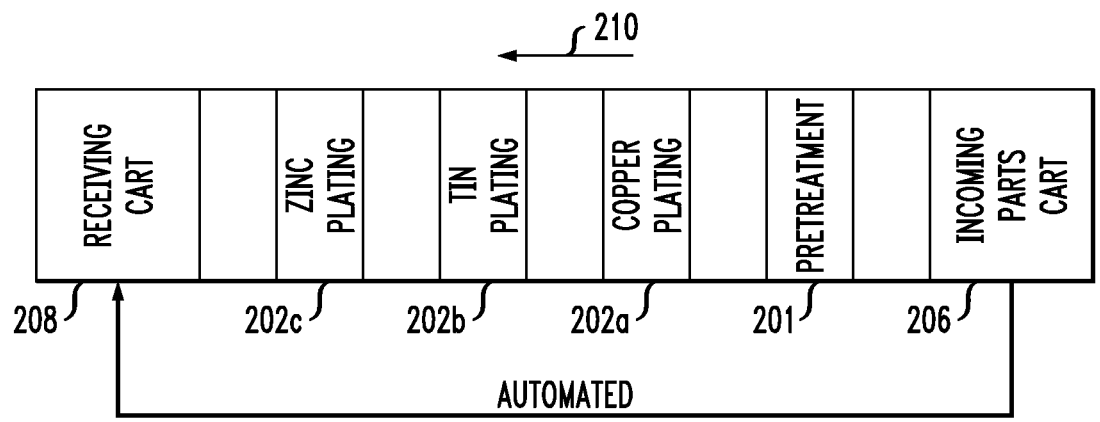
FIG. 3 is a diagram illustrating a top-down view of the apparatus of FIG. 2 according to an embodiment of the present invention.

A top-down view of apparatus 200 is provided in FIG. 3. As shown in FIG. 3, according to the path of travel of the panels (as indicated by arrow 210) panels introduced to the conveyor by cart 206 will pass over the pretreatment cell 201 followed by a copper electroplating cell 202*a*, a tin electroplating cell 202*b* and a zinc electroplating cell 202*c* before being offloaded onto cart 208. As provided above, the carts 206 and 208 may be interchangeable such that the cart 206 with incoming panels, when empty, can be used as the cart 208 to receive the completed panels. See FIG. 3. It is notable that for clarity of depiction, the features shown in FIG. 3 are not necessarily drawn to scale. For instance, as provided above, the distance between the plating cells is preferably at least one panel length (which is approximately shown in FIG. 3). The typical size of the plating tanks can be length equal to the size of the panel, width equal to the size of the panel plus the width of the metal frame and depth that is not critical. There should be enough distance between the panel (working electrode and the counter electrode for the paddles to fit in and to adequately agitate the solution next to the working electrode).

Figure 4:
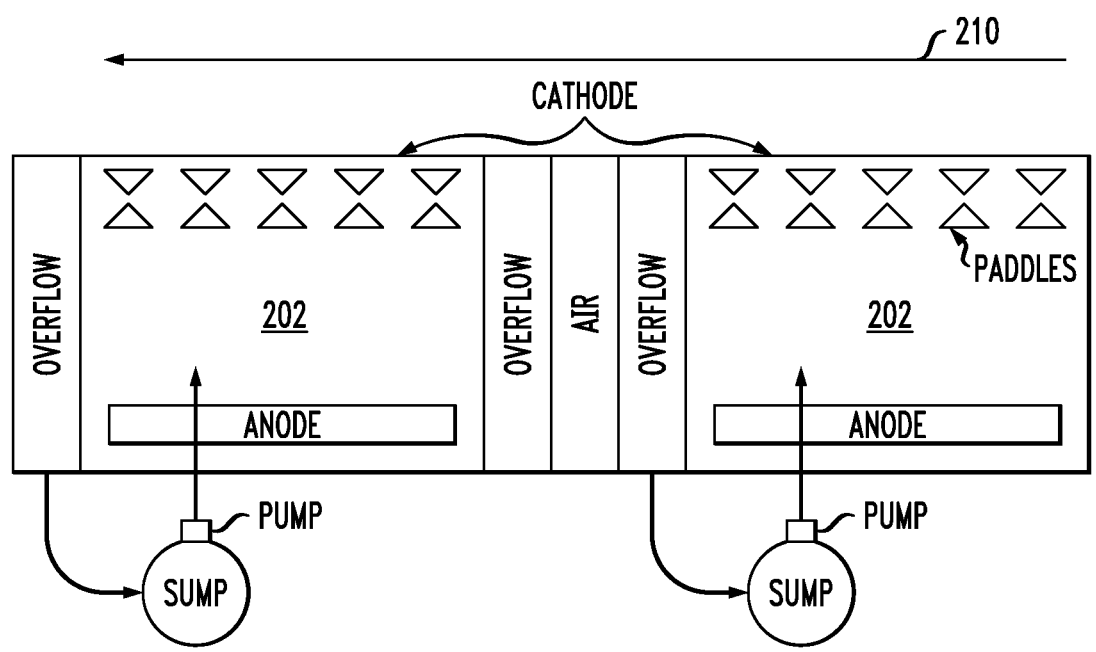
FIG. 4 is a diagram illustrating an exemplary configuration of the electroplating cells in the apparatus of FIG. 2 according to an embodiment of the present invention.

FIG. 4 is a diagram illustrating in detail one exemplary configuration of electroplating cells 202. As provided above, the number of electroplating cells 202 employed is application specific. Thus, for ease and clarity of depiction, two electroplating cells 202 are shown in FIG. 4 with the understanding that more, or fewer electroplating cells than what is shown may be employed.

FIG. 4 illustrates how the plating material from the electroplating cells is conserved in the plating process. Namely, as described in detail above, an air knife is preferably located in the path of travel of the panels (see arrow 210) in between the electroplating cells 202. When a panel passes a given one of the electroplating cells 202, the air knife serves to remove excess plating solution from the panel. As shown in FIG. 4, an overflow chamber is located after (in the path of travel) each of the cells but before the air knife. Thus the action of the air knife causes the excess plating solution which is removed from the panels to fall into the overflow chamber. A sump coupled with a liquid pump takes the solution collected in the overflow chamber and returns it to the given electroplating cell 202. As provided above, a water jet (not shown) may be located (in the path of travel) after the air knife. The water jet serves to rinse/clean the panels before the panels pass over the next electroplating cell.

As shown in FIG. 4, paddles are located in each of the electroplating cells 202. The action of the paddles is described in detail below.

Each electroplating cell 202 has an anode (in this example located at the bottom of the cell 202) and a cathode (in this example located at the top of the cell 202, along the conveyor. As will be described below, in one exemplary configuration the conveyor includes a series of metal belted tracks on rollers which i) propels/moves the panels and ii) delivers current to the panels. An example of these metal belted tracks on rollers is shown in FIG. 5.

Figure 5:
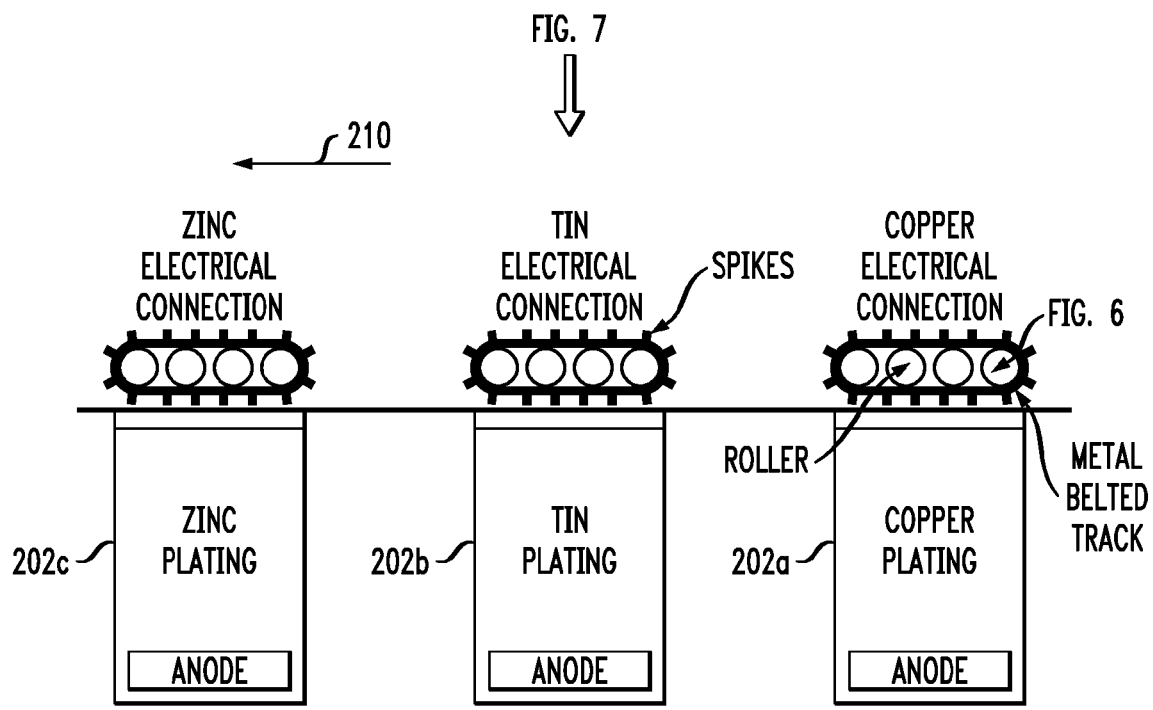
FIG. 5 is a diagram illustrating use of metal belted rollers as the conveyor in the apparatus of FIG. 2 according to an embodiment of the present invention.

FIG. 5 is a diagram illustrating use of metal belted rollers as the conveyor in apparatus 200. It is notable that for clarity of depiction, the features shown in FIG. 5 are not necessarily drawn to scale. For instance, as provided above, the distance between the plating cells is preferably at least one panel length (which is approximately shown in FIG. 5). The typical size of the plating tanks can be length equal to the size of the panel, width equal to the size of the panel plus the width of the metal frame and depth that is not critical. There should be enough distance between the panel (working electrode and the counter electrode for the paddles to fit in and to adequately agitate the solution next to the working electrode).

The conveyor functions to propel/move the panels. As shown in the example of FIG. 5, this may be accomplished using metal belted tracks on rollers. The metal belted tracks can contain spikes on an outer surface thereof which helps grip the panels and to make proper electrical contact with the panels. The rollers may also contain spikes (see for example FIG. 6, described below) to enhance contact with the metal belted tracks. Turning the rollers will cause turning of the metal belted tracks to drive the conveyor and move the panels. Specifically, in the example shown in FIG. 5, to propel the panels along the path of travel (see arrow 210), the rollers will spin counterclockwise, spinning the belts counter clockwise. By way of example only, an electrical drive motor may be connected to at least one of the rollers for a given metal belted track, to turn the roller(s) and thereby turn the metal belted track. Further, while in the example shown in FIG. 5 there are four rollers per metal belted track, this particular number of rollers is not required. At least two rollers are necessary for operation of a metal belted track. Thus, two, three, four, etc. rollers per metal belted track may be employed.

In this exemplary embodiment, the conveyor also serves to deliver current to the panels. As will be described in detail below, the panels are housed in metal racks. In order to deliver current to the metal racks, in one exemplary configuration, the rollers are metal and the current is applied to the rollers through the metal frame and a set of wiring connected to the power supply which passes through the metal belted tracks to the racks. In this exemplary configuration, the racks thus serve as the cathode during the electroplating process. This requires proper electrical contact between the rollers, metal belted tracks and the panels. As is shown in FIG. 6, described below, the rollers may have spikes on an outer surface thereof in order to ensure proper electrical contact with the metal belted tracks.

When multiple electroplating cells 202 are employed (see above), it is preferable to have one set of metal belted track/rollers per electroplating cell with each set of metal belted track/rollers connected to its own power supply. That way a different current density can be applied to the panels separately over each of the electroplating cells. Using the example in FIG. 5, moving along the path of travel, the first set of metal belted tracks/rollers provide electrical connection to a first power supply (not shown) for the copper electroplating cell 202a, the second set of metal belted tracks/rollers provide electrical connection to a second power supply (not shown) for the tin electroplating cell 202b, and so on.

Figure 6:
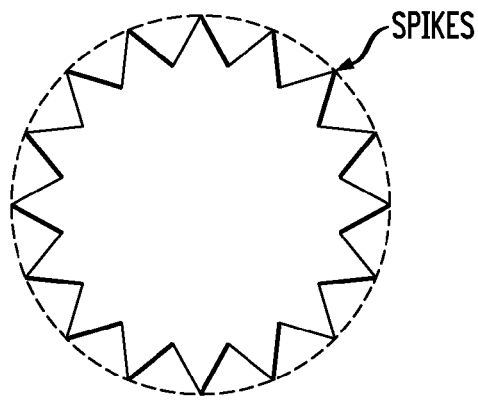
FIG. 6 is a diagram illustrating a magnified view of one possible configuration of the rollers of in FIG. 5 according to an embodiment of the present invention.

FIG. 6 is a magnified view illustrating one possible configuration of the rollers of in FIG. 5. As described above, electrical current to the panels may be provided through the rollers and the metal belted track. By employing a cross-sectional star shaped design for the rollers, the resulting spikes ensure good electrical contact with the metal belted tracks.

Figure 7:
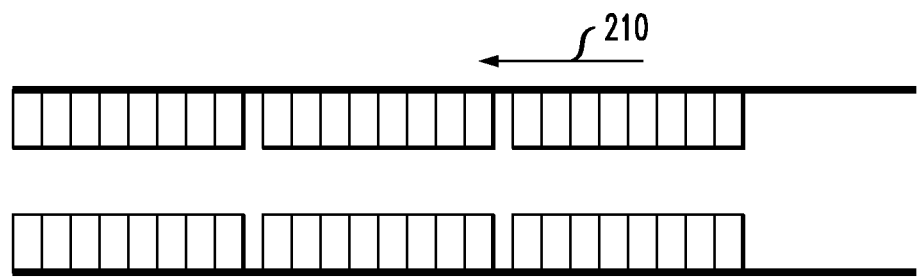
FIG. 7 is a diagram illustrating a top-down view of one exemplary configuration of the metal belted rollers according to an embodiment of the present invention.

A top-down view of the metal belted tracks/rollers is provided in FIG. 7. As shown in FIG. 7, by way of example only, there are two sets of metal belted tracks/rollers employed per electroplating cell 202, in a side by side manner. As will be described in detail below, each of the panels is housed in a metal frame which runs along the perimeter of the panel (leaving the center of the panel exposed for plating. Thus, by employing metal belted tracks on both sides of the frame will ensure proper and continuous physical/electrical contact with the frame as the panels pass over each electroplating cell 202. Further, by employing two sets of metal belted tracks/rollers, the panels will travel in a straight line along the path of travel (see arrow 210) since the belt drive will be applied equally to both sides of the panels. For instance if the belt drive was applied to only one side of a panel, there is the chance that the panel might shift and become misaligned on the conveyor.

The metal frame for use in housing the panels will now be described by way of reference to FIGS. 8A-C. It is notable that the metal frame is particularly useful in instances where the panels are formed from a non electrically conductive material, such as glass (see above). In the case where the panels are formed from an electrically conductive material, such as a metal foil (see above), the panels may or may not be housed in a metal frame. While the metal frame provides structure and rigidity during the conveyor driven process, since current can be delivered from the metal rollers, through the metal belted track directly to the (electrically conductive) panel, then the metal frame is not necessary. Thus, according to one exemplary embodiment, wherein the panels are formed from an electrically conductive material, the metal frames are not used. In this case, as will be described in detail below, the panel itself (rather than the frame) serves as the cathode during the electroplating process. Further, when an electrically conductive panel material is employed and the panel is housed in a frame (e.g., to provide additional rigidity) then both the panel and the frame serve as the cathode during the electroplating process.

Figure 8A:
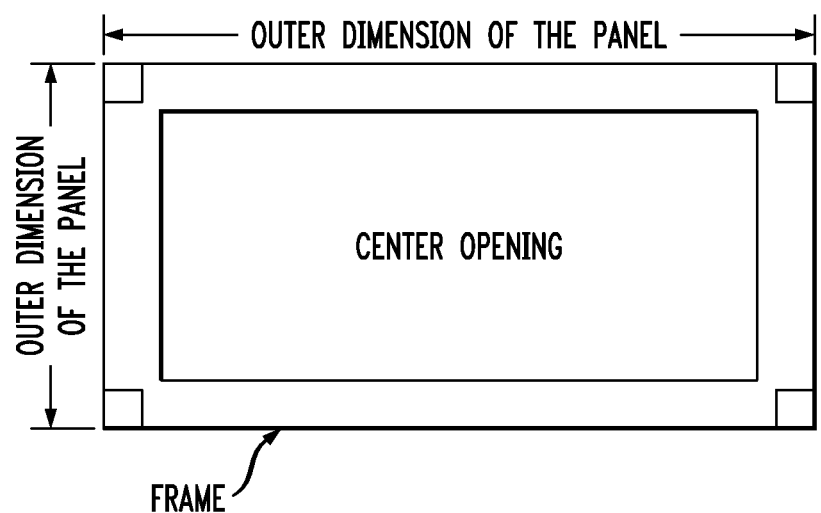
FIG. 8A is a diagram illustrating a frame for housing one of the panels according to an embodiment of the present invention.

FIG. 8A provides a top-down view of a metal rack used to house a panel. As shown in FIG. 8A, the rack has the same outer dimensions as the panel. Thus, the rack runs along the outer perimeter of the panel leaving the center of the panel open for plating. The frame is preferably formed from a metal that does not readily electroplate, such as titanium (Ti), titanium nitride (TiN), tungsten (W), titanium tungsten (TiW), tungsten nitride (WN), chromium (Cr), tantalum (Ta), tantalum nitride (TaN), molybdenum (Mo), molybdenum nitride (MoN), aluminum (Al), aluminum nitride (AlN), and refractory metals coated with ruthenium (Ru), rhodium (Rh), iridium (Ir), rhenium (Re), and osmium (Os). As described above, in one exemplary embodiment, the metal racks serve as the cathode during the electroplating process and receive current through the metal rollers and metal belted track of the conveyor system. Thus, continuous, proper contact is needed between the metal rollers, metal belted track and the metal while the panel is passing over one of the electroplating cells 202. The configuration of the metal rollers/metal belted track and the metal racks as described herein are well suited to that purpose.

Figure 8B:
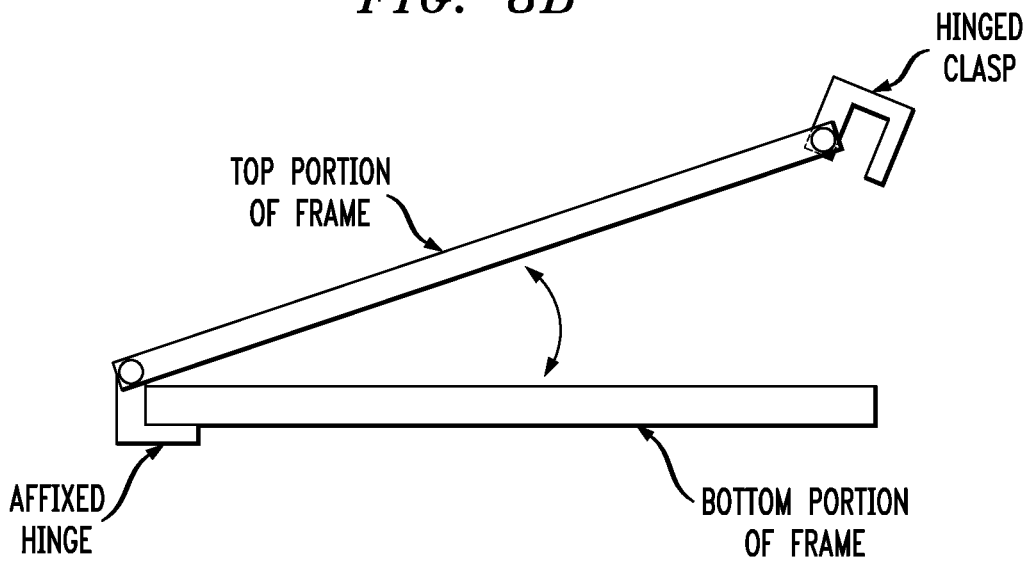
FIG. 8B is a diagram illustrating a side view of the frame of FIG. 8A showing the hinged design of the frame which permits loading and unloading of panels into the frame according to an embodiment of the present invention.
Figure 8C:
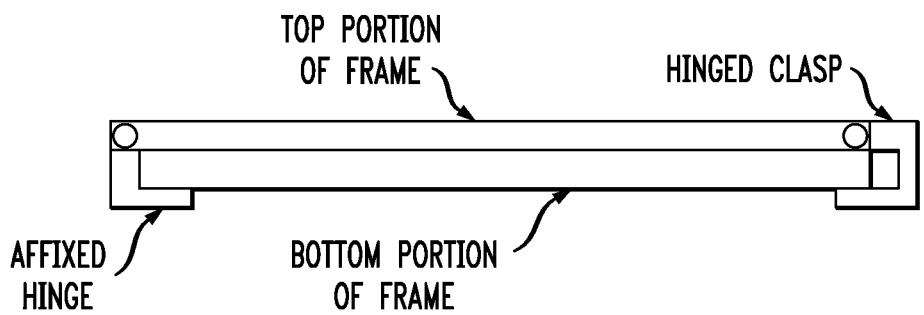
FIG. 8C is a diagram illustrating a side view of the panel in FIGS. 8A and 8B showing the frame being held in a closed position using a hinged clasp according to an embodiment of the present invention.

As shown in FIG. 8B, in one exemplary configuration, the frame has a hinged clamshell design to facilitate loading and unloading the panels into a frame. Namely, the frame consists of a top portion and a bottom portion connected to one another at one end by a hinge affixed to the bottom portion and pivotally attached to the upper portion. Opening and closing of the frame (so as to load/unload a panel) is achieved by pivoting the upper portion on the affixed hinge relative to the bottom portion. A hinged clasp is pivotally attached to a side of the upper portion opposite the hinge. The hinged clasp has (in this example) a C-shape. As shown in FIG. 8C, when the frame is closed (e.g., encasing a panel) the hinged clasp can be rotated to engage the bottom portion of the frame, thus securing the top and bottom portions in a closed position.

FIG. 9 is a diagram 900 illustrating an exemplary configuration of one of the electroplating cells 202 in apparatus 200. In this example, apparatus 200 is configured to electroplate absorber layer components on large-scale 60×120 $cm^2$ solar panels, and therefore the components of each of the electroplating cells are able to accommodate panels of that size. The same apparatus can be used for the deposition of the n-type buffer layers of cadmium sulfide (CdS), zinc sulfide (ZnS), zinc oxide (ZnO), Zn(O,S), or any other buffer material that can be deposited with solution process.

As provided above, plating of the absorber layer component(s) onto the panels occurs as the panels pass over each electroplating cell(s) 202. It is notable that the plating can be run as a continuous line process or as a discrete batch operation. In the examples shown and described above, and in FIG. 9, the panels are loaded onto the apparatus as separate panels (for example, in the example shown in FIG. 2 a discrete batch operation being run). However, apparatus 200 could also be implemented in the manner where a continuous line process is employed. For instance, the blank panel material can be provided on a roll and fed into the apparatus 200 in the same manner as described above, with the components of the absorber layer being plated onto the panel material as the panel material passes over each of the electroplating cells 202. After the panel material passes over the final electroplating cell 202, the panel material can be either re-rolled back into a roll, or cut into individual panels, and loaded onto the cart 208. This alternate embodiment is shown illustrated in FIG. 13, described below.

The electroplating cell shown in FIG. 9 is representative of any of the electroplating cells 202 in apparatus 200 (FIG. 2). In FIG. 9, a side of the electroplating cell has been removed to show the components present therein. Namely, at the bottom of electroplating cell is anode 906. In general, electrodeposition requires an anode and a cathode. In this example, the cathode is the metal rack that encloses the panel (in the depiction of FIG. 9 the metal racks are not explicitly shown but may be implemented to enclose the panels in the same manner as described above). As described above, the metal rack can be supplied electrical current by way of the metal rollers and the metal belted tracks. A continuous process can be employed with glass panels by feeding the metal racks/glass panels continuously in the electrodeposition apparatus. Alternatively, the panel material can be a continuous sheet of metal foil material (e.g., copper sheets, stainless steel sheets and/or aluminum foil sheets; see for example the description of FIG. 13, below). That way the metal belted tracks will directly contact the (electrically conductive) panel material and thus current can be provided by the metal rollers, through the metal belted tracks, to the panel (where in this case the panel itself serves as the cathode).

According to an exemplary embodiment, the anode 906 is contained within a basket. Anode materials and anode baskets suitable for use in accordance with the present techniques are commercially available. Anode baskets are typically used to retain particulate matter.

During operation, an electroplating solution is placed in the electroplating cell 902 and is agitated by paddles 908. As will be described in detail below, paddles 908 can have a triangular cross-sectional shape wherein the peaks of each triangular paddle face one another (see for example FIG. 9). A variety of shapes may be similarly employed for the paddle design such as triangles, hemispheres and diamond shape paddle designs.

As shown in FIG. 9, two rows of paddles are employed in this design, a top row of paddles adjacent to the panel and bottom row of paddles adjacent to the top row of paddles. In order to agitate the electroplating solution, the paddles move back and forth (to the left and to the right of the page in the depiction shown in FIG. 9) in the electroplating solution. Preferably, the paddles all move together in unison, i.e., the top and bottom rows of paddles all move to the left and then to the right in a repetitive motion. Paddle cells are described, for example, in U.S. Pat. No. 5,516,412 issued to Andricacos et al., entitled "Vertical Paddle Plating Cell" and in U.S. Pat. No. 5,312,532 issued to Andricacos et al., entitled "Multi-Compartment Electroplating System," the contents of each of which are incorporated by reference herein.

During plating, there is a region in the plating solution at the interface with the cathode electrode where the concentration of metal ions is different from the bulk of the plating solution. This region is called the diffusion layer. The mass transport of metal ions in the electroplating solution can be increased by agitating the plating solution, since agitation serves to decrease the thickness of the diffusion layer. According to the present techniques, this agitation is provided by way of the paddles. Namely, the paddles introduce current into the diffusion layer thickness. As will be described in detail below, use of the paddles to agitate the electroplating solution results in a uniformity of mass transport resulting in the effective plating of large, thin films with uniform thickness, uniform composition, and controlled deposit microstructure over a large area, a result not achievable with conventional electrodeposition processes.

In order to achieve the above desirable characteristics through agitation of the plating solution, the location of the paddles relative to the panel being plated is preferably such that the paddles are located very close to the panel (e.g., the top row of paddles is located a distance of from about 2 millimeters to about 4 millimeters away from the surface of the panel. Similarly, the top and bottom rows of paddles are preferably spaced very close to one another (e.g., the top row of paddles is spaced a distance of from about 3 millimeters to about 4 millimeters away from the bottom row of paddles). Locating the paddles very close to the panels ensures that the electroplating solution at the surface of the panels is well agitated.

As highlighted above, by agitating the electroplating solution near the surface of the panels, a uniformity of mass transport is achieved. Advantageously, uniform mass transport provides for plating of films with i) uniform thickness across even large (e.g., 60 cm×120 cm size) panels; notably ii) a uniform and reproducible deposit microstructure (grain structure) in the plated films; and iii) deposits with smooth surface. Both of the characteristics (uniform thickness and uniform grain structure) are difficult to achieve in general plating processes, let alone in the case of plating thin films on large panels. For instance, in one exemplary embodiment, the present plating apparatus is used to plate films with a thickness of from about 100 nm to about 1500 nm. This is a very challenging aspect ratio with extremely thin deposits on a very large substrate which cannot be achieved effectively using conventional set-ups.

In order to achieve uniform (plated) film thickness, especially in the case where the films are very thin and are being plated over a large area (see above) it is also necessary to be able to control the current density distribution in the electroplating cells. The particular current density distribution needed is dependent on factors, such as the object being plated and the chemistry of the plating solution. For instance, using the example where the panel is coated with a layer of molybdenum (see description of FIG. 1, above), molybdenum-coated panels will experience a resistivity drop at the edges of the panel. Thus, the current density should be greater at the center of the panel than at the edges of the panel. According to the present techniques, this can be accomplished in a number of ways. First, as provided above, the panel may be housed in a metal frame. In addition to supplying the electric current to the panels (see above), the edges of the metal frame can act as current deflectors to the electric current. Thus, the current density at the center of the panel will be greater than at the edges. Second, a current shielding baffle having holes therein so as to redirect the current flow can be placed between the anode and the cathode (the panel and/or the metal rack). The use of current shielding baffles in electroplating is described, for example, in U.S. Pat. No. 6,685,814 issued to Uzoh et al., entitled "Method for Enhancing the Uniformity of Electrodeposition or Electroetching" (hereinafter "Uzoh"), the contents of which are incorporated by reference herein. The exemplary use of a baffle is shown in FIG. 9. See, for example, baffle 910 which is situated in between the anode 906 and the paddles 908. In this example, the baffle 910 covers the anode 906. The use of a metal rack and the use of a baffle are not mutually exclusive, and these two measures for controlling the current density distribution may be employed together.

The baffle is preferably constructed of a non-conductive material (such as plastic). In order to control the current density distribution, the baffle has a plurality of holes therein. The size and/or distribution of the holes in the baffle are configured to control the current density distribution. For instance, in the example provided above, a greater current density at the center of the panel can be achieved by including a greater number and/or greater sized holes at the center of the baffle as opposed to at the edges of the baffle (see for example Uzoh). As highlighted above, the particular current density distribution needed is application specific and depends for example on what is being plated and/or the chemistry of the plating solution. With regard to the chemistry of the plating solution, some plating solutions are (relatively) more resistive and some plating solutions are (relatively) more conductive. Thus in the case of the exemplary plating apparatus described above having multiple electroplating cells, the configuration of the baffle used in one electroplating cell 202 may be different from the baffle used in another of the electroplating cells 202. Further, some electroplating solutions have a resistivity that is high enough such that a baffle might not be needed at all. By way of example only, this may be the case with a zinc electroplating solution. In more conductive solutions, a baffle would be needed. By way of example only, a copper plating solution may need a baffle. Thus, it may be the case that one or more electroplating cells in the apparatus use a baffle while one or more other electroplating cells do not.

As described above, the configuration of the baffle is application specific. One way to determine the placement, size, number, distribution, etc. of holes in the baffle is to simply use a trial and error method to test various configurations by doing a test plating, altering the configuration and so on until a desired result is achieved.

To further aid in creating a uniform electric field, a rectangular shield element 912 is present between the baffle 910 and the paddles 908. The use of a shield in an electroplating process is described, for example, in Uzoh. Like the baffle, the shield is preferably constructed of a non-conductive material (such as plastic). According to an exemplary embodiment, the shield element is rectangular in shape with a rectangular opening (like a picture frame), see also FIG. 10, described below. As a result of baffle 910 and shield element 912, the electric field can be shaped across the anode and the cathode so that the electric distribution can be uniform. Thickness measurements of the resulting deposit yield a measure of the uniformity of the electric field in the electroplating cell.

As highlighted above the present electrodeposition apparatus is configured to allow the full-scale production of solar panels, including standard 60×120 cm² panels. To do so, as shown in FIG. 9, each electroplating cell should have commensurate dimensions. According to an exemplary embodiment, each electroplating cell has a length l of from about 900 millimeters (mm) to about 1,500 mm, e.g., 1,200 mm, a width w of from about 500 mm to about 750 mm, e.g., 650 mm and a height h of from about 200 mm to about 500 mm, e.g., 320 mm. Further, the distance D1 between the anode 906 and the cathode (in this case the panel) is from about 150 mm to about 350 mm, e.g., 250 mm. In FIG. 9, arrows 905 indicate the direction of travel of the panels on the conveyor (see above).

Figure 10:
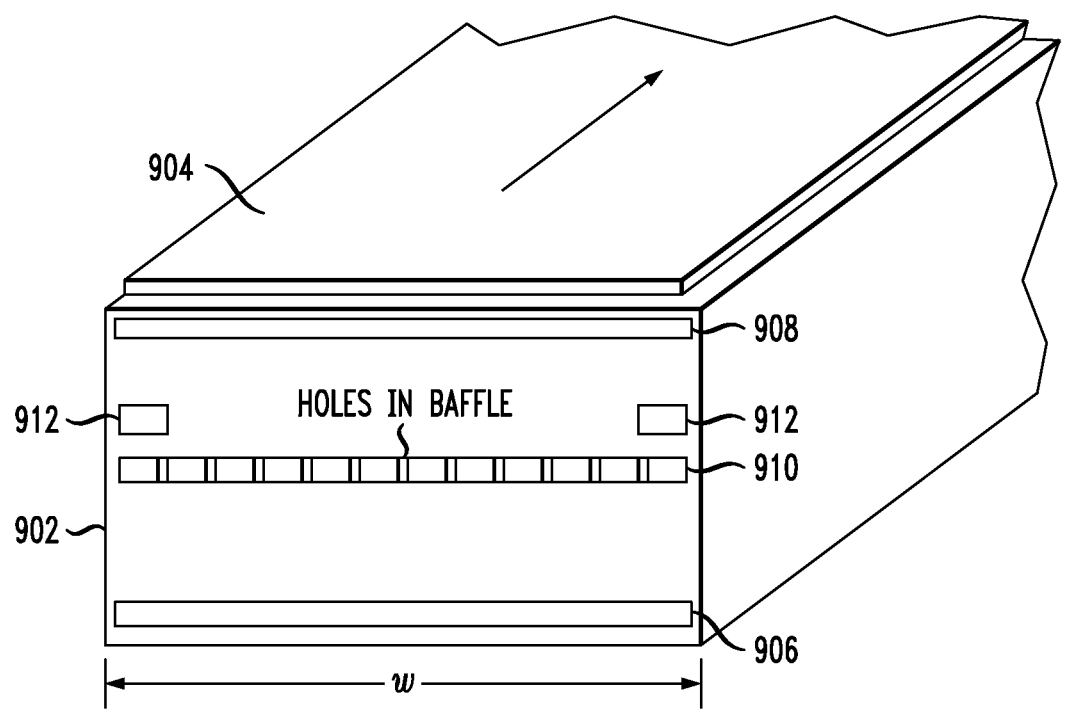
FIG. 10 is a diagram illustrating a cross-sectional cut through the electrodeposition apparatus according to an embodiment of the present invention.

FIG. 10 is a diagram illustrating a cross-sectional cut through the electroplating cell 900 (i.e., through line A1-A2, see FIG. 9). FIG. 10 illustrates the orientation of the anode 906 relative to the baffle 910 and shield element 912. As described above, baffle 910 has (a non-uniform size and/or distribution of) holes therein, see FIG. 10.

Figure 11:
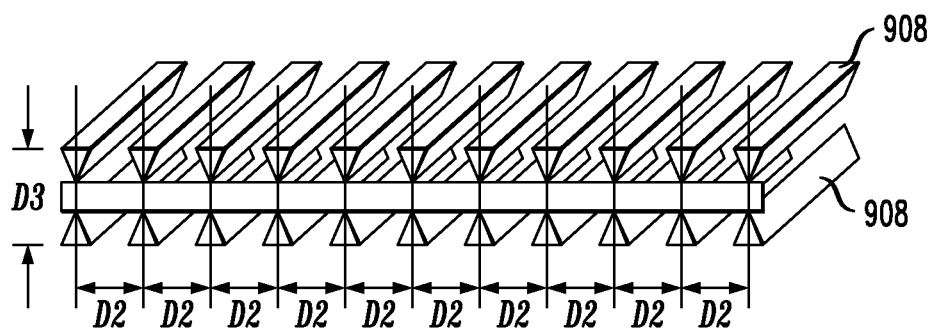
FIG. 11 is a three-dimensional diagram illustrating dimensions, orientation and exemplary shape of paddles in the electrodeposition apparatus according to an embodiment of the present invention.

FIG. 11 is a three-dimensional diagram illustrating the dimensions, orientation and exemplary shape of the paddles 908. As shown in FIG. 11, the paddles are oriented into two rows, one row on top of the other. The paddles each have a triangular cross-sectional shape, and are oriented such that the point of each triangular paddle faces the point of the triangular paddle in the opposing row. According to an exemplary embodiment, in each row the paddles are evenly spaced apart from one another, with a distance D2 of from about 75 mm to about 150 mm, e.g., 100 mm between adjacent paddles in the same row. Further, the paddles in opposing rows can be spaced apart from one another by a distance D3 of from about 35 mm to about 60 mm, e.g., 50 mm.

Figure 12:
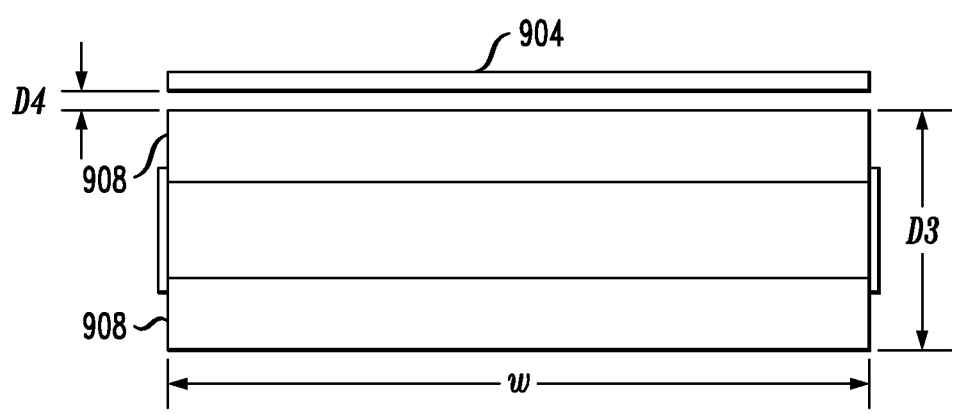
FIG. 12 is a diagram illustrating a cross-sectional cut through a portion of the electrodeposition apparatus according to an embodiment of the present invention.

FIG. 12 is a diagram illustrating a cross-sectional cut through a portion of the exemplary electroplating cell 900 (i.e., through line A1-A2, see FIG. 9). As shown in FIG. 12 there are paddles 908 from two opposing rows (see description of FIG. 11, above) which are spaced apart from one another by a distance D3. Further, according to an exemplary embodiment, panel 904 is spaced apart from the paddle 908 by a distance D4 of less than or equal to about 3 mm, e.g., from about 2 mm to about 4 mm. As described above, locating the paddles close to the surface of the substrate ensures uniformity of mass transport.

During operation of electrodeposition apparatus 200 parameters to consider include, but are not limited to, plating speed, paddle speed, speed of movement of the panels or metal foil roll and current density for electrodeposition which varies depending upon the electroplated material and the electroplating solution chemistry. The movement of the panels should be much slower than the movement of the paddles in order to achieve effective agitation of the solution next to the panel surface during electrodeposition.

As described above, the present plating apparatus (see, for example, the description of apparatus 200 of FIG. 2, above), can be configured to operate as a continuous line process. Namely, the panel material can be fed into apparatus 200 from a roll. See apparatus 1300 in FIG. 13. By comparison, in the case of a discrete batch operation (see for example, FIG. 2), individual panels are loaded onto the conveyor from a cart 206 (see above). The operation of apparatus 1300 regarding plating by the electroplating cells is the same as that described in conjunction with the description of FIG. 2, above, and that description is incorporated by reference herein. The differences lie in how the panel material is fed into and removed from the apparatus, so as to permit the apparatus to operate in a continuous line process.

By way of example only, as shown in FIG. 13 the panel material is fed into the apparatus 1300 from a roll 1306 and passes over each of the electroplating cells 1302 as a continuous sheet. After the sheet of panel material passes over the last electroplating cell 1302, the panel material can either i) be cut into distinct panels and loaded onto a cart 1308 in the same manner as described regarding the loading of panels onto cart 208 in conjunction with the description of FIG. 2, above, or ii) spooled back onto another roll 1312. In the first instance where the material is cut into individual panels, any type of cutting mechanism at the end of the conveyor can be employed wherein the cutting can be timed to the speed of the conveyor, to ensure the panels are cut to a desired, uniform size. In FIG. 13, arrow 1310 indicates the direction of travel of the panel material.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An electrodeposition apparatus, comprising:
a plurality of electroplating cells; and
a conveyor for moving individual blank solar panels over the plurality of electroplating cells, wherein each of the panels is housed in a separate metal frame that is rectangular in shape and runs along an outer perimeter of each of the panels, wherein the conveyor comprises separate metal belted tracks surrounding a plurality of metal rollers over each of the plurality of electroplating cells, such that an independent set of the metal belted tracks and the metal rollers is present over each of the plurality of electroplating cells, wherein each of the metal belted tracks has spikes on an outer surface thereof, and wherein each independent set of the metal belted tracks and the metal rollers is connected to its own independent power supply, and wherein the spikes are configured to contact the metal frame thereby providing i) a direct connection between each independent power supply and the metal frame via the metal roller and the metal belted tracks, and ii) a means for moving the panels over the plurality of electroplating cells.

2. The electrodeposition apparatus of claim 1, wherein each of the plurality of electroplating cells comprises:
an anode at a bottom of each of the plurality of electroplating cells; and
a plurality of paddles at a top of each of the plurality of electroplating cells.

3. The electrodeposition apparatus of claim 2, wherein each of the plurality of electroplating cells further comprises:
a baffle in between the anode and the paddles.

4. The electrodeposition apparatus of claim 3, wherein the baffle is constructed of a non conductive material.

5. The electrodeposition apparatus of claim 3, wherein the baffle comprises a plurality of holes therein.

6. The electrodeposition apparatus of claim 2, wherein the paddles have a triangular shape.

7. The electrodeposition apparatus of claim 1, further comprising:
an air knife between each of the plurality of electroplating cells.

8. The electrodeposition apparatus of claim 1, further comprising:
a water jet between each of the plurality of electroplating cells.

9. The electrodeposition apparatus of claim 1, wherein the conveyor comprises a separate pair of metal belted tracks over each of the plurality of electroplating cells, wherein each pair of metal belted tracks includes a first metal belted track alongside a second metal belted track such that the pair of metal belted tracks can, at the same time, make contact with two opposite sides of the metal frame along the outer perimeter the panels.

10. The electrodeposition apparatus of claim 1, wherein the metal rollers have a star-shaped cross-sectional shape.

11. An electroplating process comprising the steps of:
providing an electrodeposition apparatus having a plurality of electroplating cells containing electroplating solutions and a conveyor having separate metal belted tracks surrounding a plurality of metal rollers over each of the plurality of electroplating cells, such that an independent set of the metal belted tracks and the metal rollers is present over each of the plurality of electroplating cells, wherein each of the metal belted tracks has spikes on an outer surface thereof, and wherein each independent set of the metal belted tracks and the metal rollers is connected to its own independent power supply;
placing at least one individual blank solar panel onto the conveyor, wherein each panel is housed in a separate metal frame that is rectangular in shape and runs along an outer perimeter of the panel;
using the conveyor to move the panel over each of the plurality of electroplating cells; and
supplying current to the panel through the metal rollers and the metal belted tracks to plate the panel using the electroplating solutions, wherein the spikes on each of the metal belted tracks are configured to contact the metal frame thereby providing i) a direct connection for supplying the current between each independent power supply and the metal frame through the metal roller and the metal belted tracks, and ii) a means for moving the panel over the plurality of electroplating cells.

12. The electroplating process of claim 11, wherein each of the plurality of electroplating cells comprises an anode at a bottom of each of the plurality of electroplating cells, and wherein the panel serves as a cathode during the electroplating process.

13. The electroplating process of claim 11, wherein the panel is formed from glass or an electrically conductive material.

14. The electroplating process of claim 11, wherein the frame is made of titanium.

15. The electroplating process of claim 11, wherein each of the plurality of electroplating cells comprises a plurality of paddles at a top of each of the plurality of electroplating cells, the process further comprising the step of:
using the paddles to agitate the electroplating solutions by moving the paddles in unison back and forth through the electroplating solutions.

16. The electroplating process of claim 15, wherein each of the plurality of electroplating cells further comprises a baffle in between the anode and the paddles.

17. The electroplating process of claim 11, further comprising the steps of:
rinsing the panel after the panel is moved by the conveyor over each of the plurality of electroplating cells; and
drying the panel after the panel is moved by the conveyor over each of the plurality of electroplating cells.

18. The electroplating process of claim 11, wherein the electroplating apparatus further comprises a first cart and a second cart each having a plurality of shelves, and wherein one or more of the shelves of the first cart contain panels, the process further comprising the steps of:
feeding the panels from the shelves of the first cart onto the conveyor; and
off loading the plated panels from the conveyor onto the shelves of the second cart.

19. The electrodeposition apparatus of claim 6, wherein the plurality of paddles are oriented into opposing rows, one row on top of another, with points of the paddles in the opposing rows facing one another.

20. The electroplating process of claim 11, wherein the metal frame leaves a center of the panel open for electroplating, and wherein current is supplied to the panel through the metal rollers, the metal belted tracks, and the metal frame to plate the panel using the electroplating solutions.

21. The electrodeposition apparatus of claim 1, wherein each of the electroplating cells has a length and a width that are equal to a length and a width of each of the panels as housed in the metal frame, and wherein a distance between the electroplating cells is greater than or equal to a length of each of the panels.

* * * * *